United States Patent
Kitagawa et al.

(10) Patent No.: US 8,564,966 B2
(45) Date of Patent: Oct. 22, 2013

(54) APPARATUS FOR REDUCING CAPACITOR GENERATED NOISE ON A PRINTED CIRCUIT BOARD

(75) Inventors: Wataru Kitagawa, Fujisawa (JP); Shigeru Yuzawa, Yamato (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 497 days.

(21) Appl. No.: 12/538,399

(22) Filed: Aug. 10, 2009

(65) Prior Publication Data
US 2010/0033938 A1 Feb. 11, 2010

(30) Foreign Application Priority Data
Aug. 11, 2008 (JP) ................... 2008-206521

(51) Int. Cl.
*H05K 7/00* (2006.01)
*H01G 4/228* (2006.01)

(52) U.S. Cl.
USPC ...................... 361/760; 361/306.2

(58) Field of Classification Search
USPC ............... 361/760, 306.2
See application file for complete search history.

(56) References Cited

U.S. PATENT DOCUMENTS

| | | | | |
|---|---|---|---|---|
| 2,878,401 | A * | 3/1959 | Schwemin ............... 307/110 |
| 5,422,782 | A * | 6/1995 | Hernandez et al. ....... 361/306.2 |
| 6,166,457 | A * | 12/2000 | Iguchi et al. ............. 307/91 |
| 6,242,911 | B1 * | 6/2001 | Maschek ................ 324/247 |
| 6,337,798 | B1 * | 1/2002 | Hailey et al. ............ 361/763 |
| 6,501,664 | B1 * | 12/2002 | Krieger ................. 361/782 |
| 6,618,266 | B2 * | 9/2003 | Blakely et al. .......... 361/763 |
| 6,763,509 | B2 * | 7/2004 | Korobkov ............... 716/122 |
| 6,795,294 | B2 * | 9/2004 | Kuroda et al. .......... 361/306.1 |
| 6,859,352 | B1 * | 2/2005 | Kanasaki et al. ........ 361/302 |
| 6,900,978 | B2 * | 5/2005 | Shimizu et al. ......... 361/328 |
| 6,992,374 | B1 * | 1/2006 | Yang et al. ............. 257/678 |
| 7,009,832 | B1 * | 3/2006 | Chen et al. ............. 361/306.1 |
| 7,619,325 | B1 * | 11/2009 | Hennessy et al. ........ 307/147 |
| 7,889,479 | B2 * | 2/2011 | Lee et al. .............. 361/306.2 |
| 2002/0107647 | A1 * | 8/2002 | Anderson et al. ........ 702/65 |
| 2004/0022006 | A1 * | 2/2004 | Liao .................... 361/301.1 |
| 2004/0145041 | A1 * | 7/2004 | Terui et al. ............ 257/691 |
| 2005/0017321 | A1 * | 1/2005 | Hakkarainen et al. ..... 257/532 |
| 2005/0052374 | A1 * | 3/2005 | Devos et al. ........... 345/82 |
| 2005/0280137 | A1 * | 12/2005 | Cornelius .............. 257/691 |
| 2007/0138587 | A1 * | 6/2007 | Shin et al. ............. 257/435 |
| 2008/0099879 | A1 * | 5/2008 | Chen et al. ............. 257/532 |
| 2010/0254108 | A1 * | 10/2010 | Kim et al. .............. 361/782 |

FOREIGN PATENT DOCUMENTS

| JP | 06268012 A | * | 9/1994 |
|---|---|---|---|
| JP | 2001-023849 | | 1/2001 |
| JP | 2002-232110 | | 8/2002 |

(Continued)

*Primary Examiner* — Timothy Thompson
*Assistant Examiner* — Nathan Milakovich
(74) *Attorney, Agent, or Firm* — Ference & Associates LLC

(57) ABSTRACT

Embodiments of the present invention provide an arrangement structure capable of reducing noise caused by a laminated ceramic capacitor mounted on a printed circuit board. A unit arrangement structure includes ceramic capacitors. Among the laminated ceramic capacitors, capacitors are arranged so that capacitor axes thereof extend along a first axis, while the other ceramic capacitors are arranged so that capacitor axes thereof extend along a second axis crossing the first axis. In accordance with such an arrangement structure, it is possible to effectively suppress noise even in the case of single-side mounting.

9 Claims, 6 Drawing Sheets

(56) References Cited

FOREIGN PATENT DOCUMENTS

| | | |
|---|---|---|
| JP | 2003-324030 | 11/2003 |
| JP | 2004006488 A * | 1/2004 |
| JP | 2004-273935 | 9/2004 |
| JP | 2005-050962 | 2/2005 |
| JP | 2007115759 A * | 5/2007 |

* cited by examiner

APPARATUS FOR REDUCING CAPACITOR GENERATED NOISE ON A PRINTED CIRCUIT BOARD

CLAIM OF PRIORITY

This application claims priority from Japanese Patent Application No 2008-206521, filed on Aug. 11, 2008, and which is fully incorporated by reference as if set forth herein.

FIELD OF THE INVENTION

The present invention generally relates to a technique for reducing noise generated by ceramic capacitors mounted on a printed circuit board.

BACKGROUND OF THE INVENTION

Examples of capacitors used in electronic apparatuses include ceramic capacitors, tantalum electrolytic capacitors, aluminum electrolytic capacitors, and film capacitors. Although there are single-layer ceramic capacitors which are constructed of a pair of electrodes, most ceramic capacitors are constructed of laminated ceramic capacitors having a structure in which a plurality of electrode pairs is laminated. The ceramic capacitors can be manufactured in a small size because of their dielectrics having high permittivity and are widely used in modern electronic apparatuses because of their capacitances exhibiting small changes with aging. The ceramic materials used in ceramic capacitors exhibit ferroelectric properties and so-called piezoelectric or electrostriction such that the ceramic materials are mechanically deformed when an electric voltage is applied to both ends of the capacitor.

In ceramic capacitors, high-permittivity ferroelectrics, which are mainly made of barium titanate ($BaTiO_3$), are typically used. Such ferroelectrics have a perovskite crystal structure, so that, in their sintered state, spontaneous polarization occurs within them and crystal grains are oriented in random directions. Therefore, even when an external electric field is applied to the ferroelectrics being in such a state, piezoelectric effects of the respective crystal grains cancel out, whereby the ferroelectrics as a whole do not exhibit piezoelectric properties. When a high DC voltage is applied to the ferroelectrics, however, the respective crystal grains are polarized in the direction of the electric field, thereby exhibiting piezoelectric properties.

A DC-DC converter mounted on a computer supplies electric power to electronic devices by converting an input DC voltage into predetermined DC voltages appropriate for the respective electronic devices. In an input/output circuit of the DC-DC converter, a ripple voltage of an audible frequency range is generated due to its switching operation in the form of being superimposed on the DC voltage. A central processing unit (CPU) is also connected to the DC-DC converter as a load. When the computer is equipped with a UHCI_USB (Universal Host Controller Interface—Universal Serial Bus) master, the CPU transitions between C2 and C4 states every 1 ms in order to perform a power saving operation, and this transition appears as a ripple voltage of 1 KHz to the input/output circuit of the DC-DC converter.

The input/output circuit of the DC-DC converter or an IC chip is connected to a decoupling capacitor in order to reduce noise based on the switching operation. When the voltage of an audible frequency range superimposed on the DC voltage is applied to the decoupling capacitor, the capacitor exhibits a reverse piezoelectric effect in response to an alternating component of the electric field, so that the capacitor's body resonates with its natural frequency and vibrates. Therefore, when laminated ceramic capacitors are mounted on a printed circuit board (PCB) as decoupling capacitors, the capacitors' vibrations are transmitted to the PCB and generate noise.

Japanese Patent Application Laid-Open No. 2002-232110 teaches a technique for reducing vibration noise which is generated when vibrations of first and second ceramic capacitors generated due to a ripple component based on their charging/discharging operations are transmitted to a circuit board. The first and second ceramic capacitors are arranged so as to be aligned on one surface side of the circuit board, and the vibration waves transmitted to the circuit board have approximately equal amplitudes and opposite phases on one surface side of the circuit board.

Japanese Patent Application Laid-Open No. 2004-273935 teaches a ceramic capacitor having a structure capable of suppressing transmission of vibration to a circuit board. The ceramic capacitor element includes a dielectric base, a pair of terminal electrodes, and a plurality of internal electrodes. The pair of terminal electrodes is formed at opposite lateral ends of the dielectric base, and each of the plurality of internal electrodes has one end thereof being connected to the terminal electrode and the other end thereof being left as an open end. A pair of metal terminals has a respective board mounting portion and is connected to a corresponding terminal electrode. The board mounting portions are disposed on one mounting surface, and the mounting surface intersects the electrode face of the internal electrodes at approximately right angles. Owing to such a construction, the vibration transmitted via the metal terminals to the board can be reduced even when the ceramic capacitor element vibrates due to electrostriction phenomenon.

Japanese Patent Application Laid-Open No. 2003-324030 teaches a method of mounting a laminated ceramic capacitor on a circuit board capable of reducing noise generated due to piezoelectric phenomenon. In this method, two laminated ceramic capacitors connected in series are mounted at plane symmetry positions on top and back surfaces of a circuit board. According to this method, since two capacitors are connected in series, vibrations transmitted from respective capacitors to the circuit board cancel out, whereby the circuit board is prevented from resonating.

SUMMARY OF THE INVENTION

Embodiments of the present invention broadly contemplate an arrangement structure of a laminated ceramic capacitor on a circuit board, capable of effectively achieving noise reduction. Embodiments of the present invention provide an arrangement structure with a few restrictions for noise reduction. Embodiments of the present invention also provide an arrangement structure capable of achieving noise reduction via single-side mounting on a printed circuit board. Embodiments of the present invention also provide a printed circuit board mounting thereon a plurality of laminated ceramic capacitors having the arrangement structure.

In summary, one aspect of the invention provides an apparatus comprising: one or more processors; a printed circuit board in operative connection with the one or more processors; and one or more unit arrangements disposed on the printed circuit board, the one or more unit arrangements comprising: one or more capacitors situated on the printed circuit board along a first axis; and one or more capacitors situated on the printed circuit board along a second axis; wherein the first axis intersects with the second axis.

Furthermore, an additional aspect of the invention provides an apparatus comprising: a housing; a display device; one or more processors; one or more unit arrangements comprising a first and second plurality of capacitors; and a printed circuit board located within the housing, the printed circuit board operably engaging the one or more processors and having the one or more unit arrangements mounted thereon; wherein the first plurality of capacitors is situated along a first axis, the second plurality of capacitors is situated along a second axis, and the first axis and the second axis intersect each other; and wherein an external terminal of each capacitor of the first plurality of capacitors is connected to an external terminal of a capacitor of the second plurality of capacitors.

Moreover, another aspect of the invention provides an apparatus comprising: one or more unit arrangements disposed on a printed circuit board, the one or more unit arrangements comprising: one or more capacitors situated on the printed circuit board along a first axis; and one or more capacitors situated on the printed circuit board along a second axis; wherein the first axis intersects with the second axis.

For a better understanding of the present invention, together with other and further features and advantages thereof, reference is made to the following description, taken in conjunction with the accompanying drawings, and the scope of the invention will be pointed out in the appended claims.

DETAILED DESCRIPTION OF THE INVENTION

Figure 1:
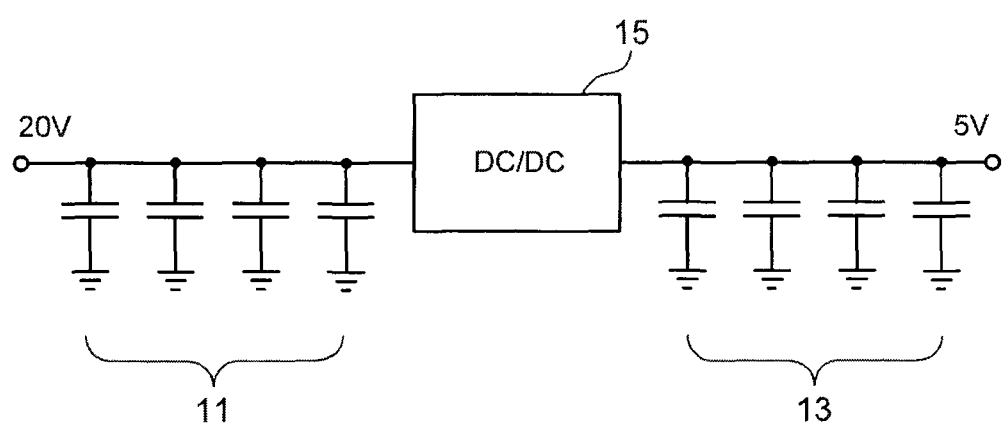
FIG. 1 illustrates a connection state between decoupling capacitors and a DC-DC converter mounted on a note PC.

It will be readily understood that the aspects of the present invention, as generally described and illustrated in the figures herein, may be arranged and designed in a wide variety of different configurations in addition to the described presently preferred embodiments. Thus, the following more detailed description of the embodiments of the present invention, as represented in the figures, is not intended to limit the scope of the invention, as claimed, but is merely representative of selected presently preferred embodiments of the invention.

Reference throughout this specification to "one embodiment" or "an embodiment" (or the like) means that a particular feature, structure, or characteristic described in connection with the embodiment is included in at least one embodiment of the present invention. Thus, appearances of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments of the invention. One skilled in the relevant art will recognize, however, that embodiments of the invention can be practiced without one or more of the specific details, or with other methods, components, materials, etc. In other instances, well-known structures, materials, or operations are not shown or described in detail to avoid obscuring aspects of the invention.

The illustrated embodiments of the invention will be best understood by reference to the drawings. The following description is intended only by way of example, and simply illustrates certain selected presently preferred embodiments of the invention as claimed herein.

The inventions disclosed in Japanese Patent Application Laid-Open Nos. 2002-232110 and 2003-324030 adjust the arrangement of two capacitors and the phase of electric current to cancel out the vibrations transmitted to the circuit board from the respective capacitors. However, it is necessary to strictly adjust the capacitor arrangement and the electric current phase in order to cancel out the vibrations. Moreover, in the case of portable computers having a narrow mounting space for a circuit board, it is difficult to mount capacitors on both sides of the circuit board, and thus the above inventions can be applied to limited applications. In the case of the invention disclosed in Japanese Patent Application Laid-Open No. 2004-273935, the capacitor size increases and the manufacturing cost increases.

Therefore, aspects of the present invention provide an arrangement structure of a laminated ceramic capacitor on a circuit board, capable of effectively achieving noise reduction. Aspects of the present invention also provide an arrangement structure with a few restrictions for noise reduction. Aspects of the present invention also provide an arrangement structure capable of achieving noise reduction via single-side mounting on a printed circuit board. Still further aspects of the present invention provide a printed circuit board mounting thereon a plurality of laminated ceramic capacitors having the arrangement structure.

At least one presently preferred embodiment of the invention provides systems and methods for mounting a plurality of laminated ceramic capacitors on a printed circuit board. Embodiments of the invention also provide an overall arrangement structure having a plurality of unit arrangement structures arranged thereon. In another preferred embodiment of the invention, an arrangement structure constructed of four laminated ceramic capacitors has two laminated ceramic capacitors arranged such that the capacitor axes thereof extend along a first axis, while the two other laminated ceramic capacitors are arranged such that capacitor axes thereof extend along a second axis crossing the first axis.

According to this unit arrangement structure, it is possible to achieve noise suppression even when the laminated ceramic capacitors are mounted on single side of the printed circuit board. The four laminated ceramic capacitors have respective external terminals being connected to each other in the proximity of a position where the first axis and the second axis cross each other so that they form two pairs of series-connected laminated ceramic capacitors. It is preferred that the first axis and the second axis intersect at right angles. When the four laminated ceramic capacitors are configured to have the same outside dimensions, it is preferred that a distance between two laminated ceramic capacitors, of which the respective external terminals oppose each other, is shorter than a length of each laminated ceramic capacitor in the direction of the capacitor axis thereof.

In accordance with an embodiment of the present invention, two unit arrangement structures may be arranged on top and back surfaces of the printed circuit board, respectively. In accordance with a first aspect of the overall arrangement structure using the unit arrangement structure, a plurality of unit arrangement structures may be arranged on the printed circuit board so that an arrangement axis thereof extends along the first axis or the second axis of each of the unit arrangement structures. In accordance with a second aspect of the overall arrangement structure, a plurality of unit arrangement structures may be arranged on the printed circuit board so that an arrangement axis thereof extends along a bisecting line of the first and second axes of each of the unit arrangement structures. In such a case, it is preferred that the unit arrangement structures are arranged at substantially equal intervals, or the overall arrangement structure is arranged on top and back surfaces of the printed circuit board.

FIG. 1 illustrates a connection state between decoupling capacitors and a DC-DC converter mounted on a notebook personal computer (hereinafter, referred to as a note PC). A DC-DC converter 15 performs switching operations in order to convert an input voltage of DC 20 V supplied from an AC/DC adapter, for example, into an output voltage of DC 5 V. The DC-DC converter 15 has its secondary side being connected, directly or via another DC-DC converter, to processors, an LCD, and various electronic devices mounted on a motherboard and electric power can be supplied thereto.

The DC-DC converter 15 has its primary side being connected to a decoupling capacitor array 11 which is constructed of a plurality of laminated ceramic capacitors. The decoupling capacitors are also referred to as bypass capacitors, and are used for lowering a line impedance with respect to high-frequency voltages to restrict movement of charges along the line in response to the switching of the DC-DC converter 15 to a local range. Similarly, the DC-DC converter 15 has its secondary side being connected to a decoupling capacitor array 13 which is constructed of a plurality of laminated ceramic capacitors. The decoupling capacitor arrays 11 and 13 are surface-mounted on a PCB.

The note PC is equipped with a UHCI_USB master, and a ripple voltage generated at a frequency of 1 KHz from the DC-DC converter 15 is superimposed on the base voltage of DC 20 V or 5 V. Therefore, a ripple current of 1 KHz flows in the decoupling capacitor arrays 11 and 13, and noise of 1 KHz is observed from the vicinity of the decoupling capacitor arrays 11 and 13 when a microphone is used.

Figure 2A:
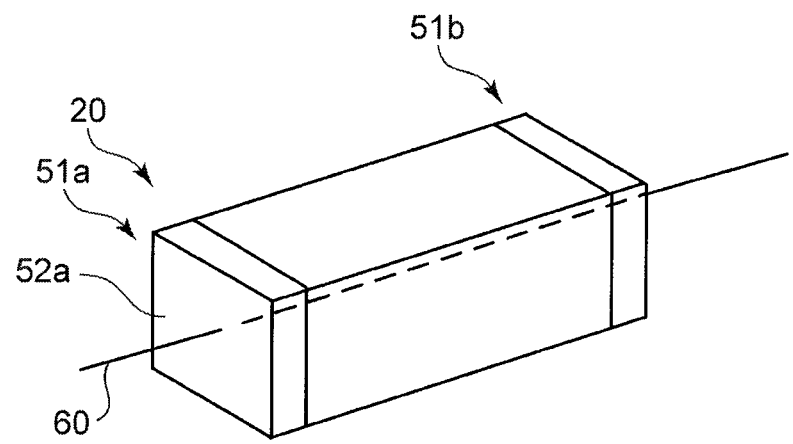
FIGS. 2A and 2B illustrate a mounting structure of a capacitor on a printed circuit board.
Figure 2B:
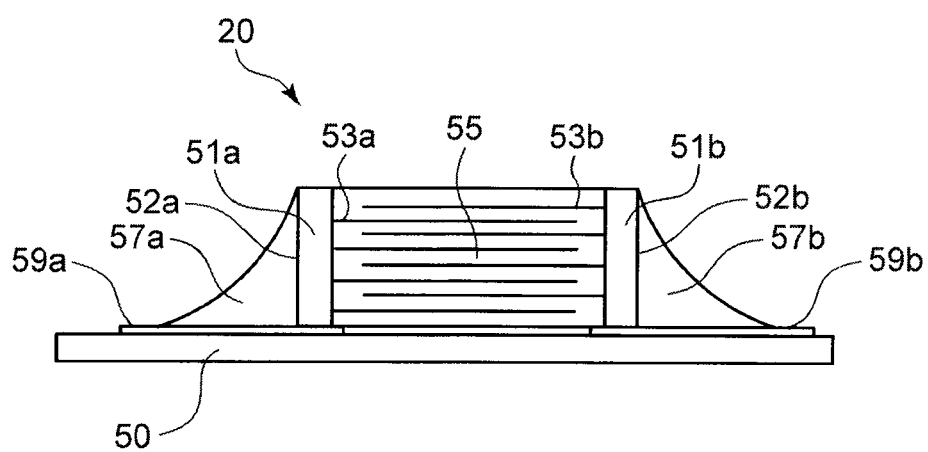

FIG. 2A is a perspective external view of a laminated ceramic capacitor 20 (hereinafter, simply referred to as capacitor), and FIG. 2B illustrates a mounting structure of the capacitor 20 on a PCB 50. The capacitor 20 has an approximately rectangular outer shape, and includes a pair of external terminals 51a and 51b, a plurality of internal electrodes 53a and 53b connected to the respective external terminals, and a dielectric 55 made of barium titanate ($BaTiO_3$). The external terminals 51a and 51b do not have polarity and the power-supply-side and ground-side wirings can be connected to any of the external terminals. The external terminals 51a and 51b are provided with connecting faces 52a and 52b, respectively.

In this specification, an axis connecting the central points of the two connecting faces 52a and 52b of the capacitor 20 will be referred to as a capacitor axis 60. When the capacitor 20 is mounted on the PCB 50, the connecting faces of the external terminals 51a and 51b are electrically coupled to solder fillets 57a and 57b which are formed on lands 59a and 59b provided on a top surface of the PCB 50 as part of a wiring pattern by means of iron soldering or reflow soldering using lead-free solder. Therefore, vibration occurring in the capacitor 20 is transmitted to the PCB 50 via the external terminals 51a and 51b, the solder fillets 57a and 57b, and the lands 59a and 59b.

The PCB 50 is a rigid multi-layer board on which ten conductive layers are stacked. The PCB 50 is generally fixed to a housing or a metal frame of the note PC at a plurality of print settings but is structured to vibrate in a direction perpendicular to the plane of the PCB 50 at other positions thereof different from the fixation points. The capacitor 20 vibrates in a bending vibration mode when it is vibrating at an audible frequency range, thereby generating noise when the PCB 50 resonates with the vibration. When a plurality of the capacitors 20 is mounted on the PCB 50, vibrations transmitted from individual capacitors are combined together in the PCB 50, causing the PCB 50 to vibrate in a complex vibration mode.

In the present invention, the vibration of the PCB 50 is suppressed by a characteristic arrangement structure of the plural capacitors mounted thereon. In some cases, the decoupling capacitor arrays 11 and 13 described with reference to FIG. 1 are constructed, for example, of about forty capacitors 20, respectively. In general, the forty capacitors 20 are mounted on the PCB 50 in such a way that they are arranged at regular intervals on one straight line so that respective capacitor axes 60 intersect at right angles, or twenty capacitors each are arranged on two parallel straight lines so that respective capacitor axes 60 intersect at right angles. In the process of creating the present invention, the present inventors conducted experimental tests on the dependencies on an arrangement structure, of the audible frequency range vibration occurring in the PCB 50 so as to verify the hypothesis that noise can be suppressed by devising the above arrangement structure.

FIG. 3 is a view for describing basic patterns of a plurality of arrangement structures that were tested. In connection with forming of the respective basic patterns shown in FIG. 3, the same electrical ratings, manufacturers, outside dimensions, application voltages, and connected loads of the respective capacitors 20, and the same structure of the PCB 50 are used. Moreover, the method of soldering them to the PCB 50 is the same as that in FIG. 2B. Furthermore, the orientations of the internal electrodes 53a and 53b with respect to the plane of the PCB 50 are randomly chosen. The tests were conducted in such a way that the respective basic patterns shown in FIGS. 3A to 3K are periodically repeated in the directions of arrangement axes 61 and 63 so that forty capacitors in total are mounted on both or single side of the PCB 50. In FIG. 3, the external terminals of the capacitors being connected to the ground side are illustrated as filled rectangles, while the external terminals connected to the power supply side are illustrated as outlined rectangles.

Figure 3A:
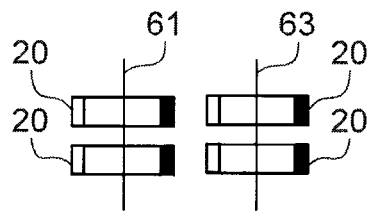
FIGS. 3A-3K are views for describing basic patterns of arrangement structures that were tested.

FIG. 3A illustrates a basic arrangement structure which was conventionally employed, illustrating a basic pattern when twenty capacitors each are arranged on a top surface of the PCB 50 at equal intervals on arrangement axes 61 and 63. The arrangement axes 61 and 63 pass through the central points in direction of the capacitor axes of the respective capacitors 20. The capacitors 20 extending along the arrangement axis 61 and the capacitors 20 extending along the arrangement axis 63 have respective external terminals being arranged to oppose each other, so that the external terminals connected to the power supply side have the same orientations as the external terminals connected to the ground side. In FIG. 3B and subsequent figures, the arrangement axes 61 and 63 are omitted to avoid cluttering the figure. FIG. 3B illustrates the basic pattern of FIG. 3A when the capacitors 20 on the arrangement axis 63 are arranged on the back surface of the PCB 50 so as to be substantially symmetrical to the capacitors 20 on the arrangement axis 61 with respect to the plane of the PCB.

Figure 3H:
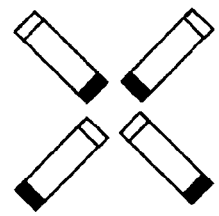
Figure 3B:
Figure 3C:
Figure 3I:
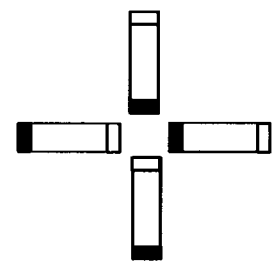
Figure 3D:
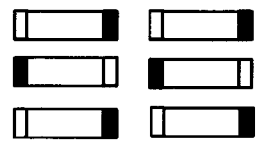
Figure 3J:
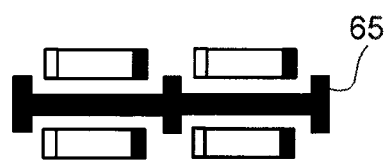
Figure 3E:
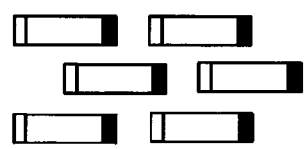

FIG. 3C illustrates the basic pattern of FIG. 3A when the capacitors 20 on the arrangement axis 61 and the capacitors 20 on the arrangement axis 63 are arranged so that the respective external terminals connected to the ground side oppose each other. FIG. 3D illustrates the basic pattern of FIG. 3A when the respective capacitors 20 on the arrangement axes 61 and 63 are arranged so that the orientations of the external terminals connected to the power supply side and the external terminals connected to the ground side change alternately and the external terminals connected to the power supply side and the external terminals connected to the ground side oppose each other. FIG. 3E illustrates the basic pattern of FIG. 3A when the respective capacitors 20 on the arrangement axes 61 and 63 are arranged so as to be alternately shifted in the direction of their capacitor axis by a half of their length in direction of their capacitor axis.

Figure 3K:
Figure 3F:
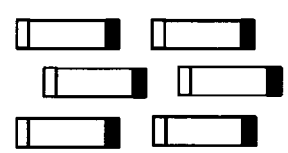
Figure 3G:
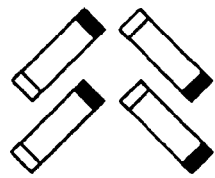

FIG. 3F illustrates the basic pattern of FIG. 3A when the respective capacitors 20 on the arrangement axes 61 and 63 are arranged so as to be alternately shifted in the direction of their capacitor axis by one third of their length in direction of their capacitor axis. FIG. 3G illustrates the basic pattern of FIG. 3A when the capacitors 20 on the arrangement axis 61 are turned by 45 degrees to the left and the capacitors 20 on the arrangement axis 63 are turned by 45 degrees to the right.

FIG. 3H illustrates a basic pattern when four capacitors 20 are arranged so as to form an X shape. FIG. 3I illustrates a basic pattern when four capacitors 20 are arranged so as to form a cross shape. The detailed description of the arrangements shown in FIGS. 3H and 3I will be provided later. FIG. 3J illustrates the basic pattern of FIG. 3A when an opening 65 is formed on the PCB 50 so as to pass between adjacent capacitors. FIG. 3K illustrates the basic pattern of FIG. 3A when the respective capacitors 20 on the arrangement axis 63 are shifted in the direction of their arrangement axis 63 so that the capacitor axes 60 are positioned at the central points between the adjacent capacitors 20 on the arrangement axis 61. The basic patterns excluding that of FIG. 3B were also tested for cases where the basic patterns are arranged on both top and back surfaces of the PCB 50. In the case of double-side arrangement, twenty capacitors having the respective basic patterns were arranged on each side.

Sensory evaluation was conducted by three examiners to assess the noise occurrence state using four levels by applying a DC current to a load generating ripple voltages of an audible frequency component with the load being connected to forty capacitors 20, respectively, arranged in the basic patterns of FIGS. 3A to 3K. The results showed that for any basic pattern, the lowest noise was generated when the capacitors 20 were mounted on both sides of the PCB 50 and the next lowest noise was generated when the capacitors having the basic patterns of FIGS. 3H and 3I were mounted on a single side. Therefore, it was found that mounting the capacitors on both sides of the PCB 50 was effective in reducing the noise.

Because differently from Japanese Patent Application Laid-Open No. 2003-324030, the above tests did not set the current phases to be reversed, the noise reduction effect by the double-side mounting is thought to result from a different principle than that of Japanese Patent Application Laid-Open No. 2003-324030 where vibrations cancel out due to the reversed phases. Although the vibration and noise can be reduced by the double-side mounting when a sufficient mounting space can be secured on the PCB 50, the double-side mounting of capacitors is often difficult to be employed in a note PC because the note PC has a great limitation in increasing its thickness dimension within its housing. In the present embodiment, however, the noise can be effectively suppressed even with a single-side mounting by mounting a plurality of capacitors 20 to have the arrangement structure of the basic patterns of FIGS. 3H and 3I.

Figure 4:
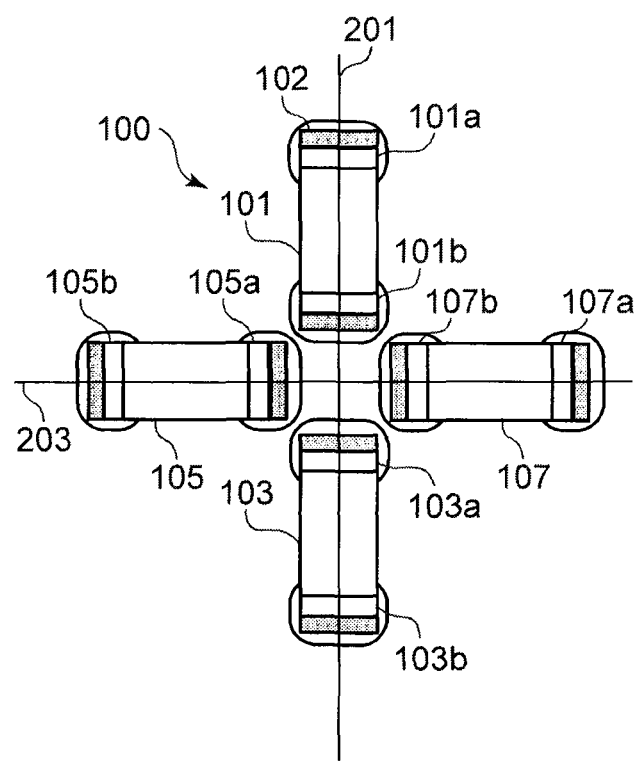
FIG. 4 is a view for describing a unit arrangement structure of the basic patterns shown in FIGS. 3H and 3I.

FIG. 4 is a view for describing a unit arrangement structure of the basic patterns shown in FIGS. 3H and 3I. The unit arrangement structure 100 is constructed of four capacitors 101, 103, 105, and 107 having the same structure as the capacitors 20. The same structure means that their forms, materials, electrical ratings, and outside dimensions are approximately the same. It should be noted, however, that the scope of the embodiments of the present invention is not limited to the case where the four capacitors have the same structure. The capacitors 101 and 103 are arranged so that a capacitor axis thereof extends along an axis 201, and the capacitors 105 and 107 are arranged so that a capacitor axis thereof extends along an axis 203. The axes 201 and 203 intersect at right angles. It should be noted, however, that the embodiments of the present invention are not limited to the case where the axes 201 and 203 intersect at perfect right angles.

The connecting face of an external terminal 101b and the connecting face of an external terminal 103a oppose each other at a predetermined distance, and the connecting face of an external terminal 105a and the connecting face of an external terminal 107b oppose each other at the same distance as the predetermined distance. This distance is preferably smaller than the length in direction of the capacitor axis of the capacitor 20. The external terminals 101a, 101b, 103a, 103b, 105a, 105b, 107a, and 107b are connected to the lands formed on the PCB 50 by means of solder fillets 102, respectively, as illustrated in FIG. 2. The external terminals 101b and 105a are connected together via the wiring pattern of the PCB 50, and the external terminals 103a and 107b are connected together via the wiring pattern of the PCB 50.

In this unit arrangement structure 100, the capacitors 101 and 105 are paired and connected in series and the capacitors 103 and 107 are paired and connected in series. When the unit arrangement structure 100 is connected to an input/output circuit of the DC-DC converter 15, the external terminals 101a and 107a are connected to the power supply side, and the external terminals 105b and 103b are connected to the ground side, for example. In this case, in each pair of capacitors, the external terminals connected to the power supply side and the external terminals connected to the ground side may be interchanged arbitrarily without being affected by other capacitor pairs.

Figure 5:
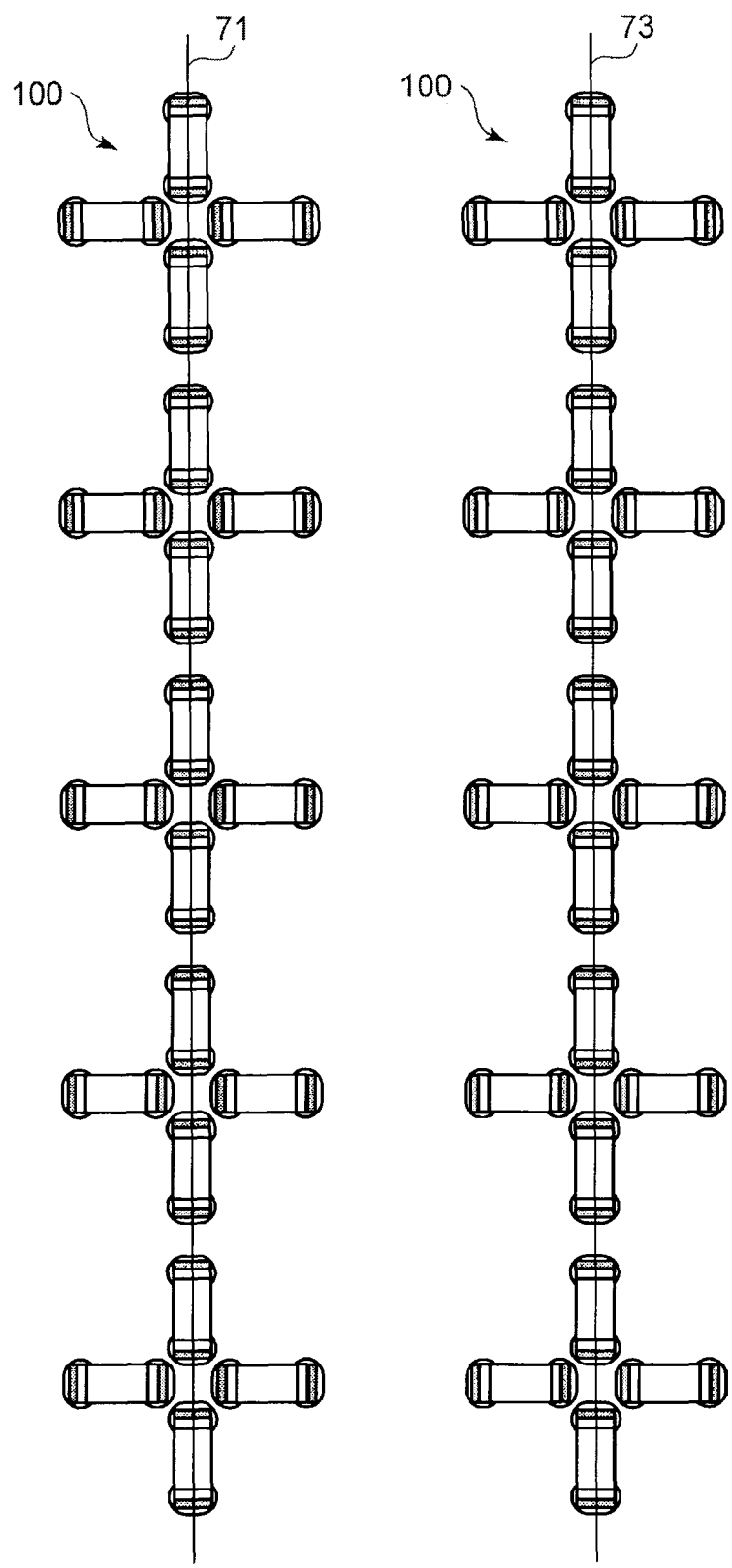
FIG. 5 is a view for describing a pattern used when a plurality of capacitors is mounted on a PCB using a unit arrangement structure.
Figure 6:
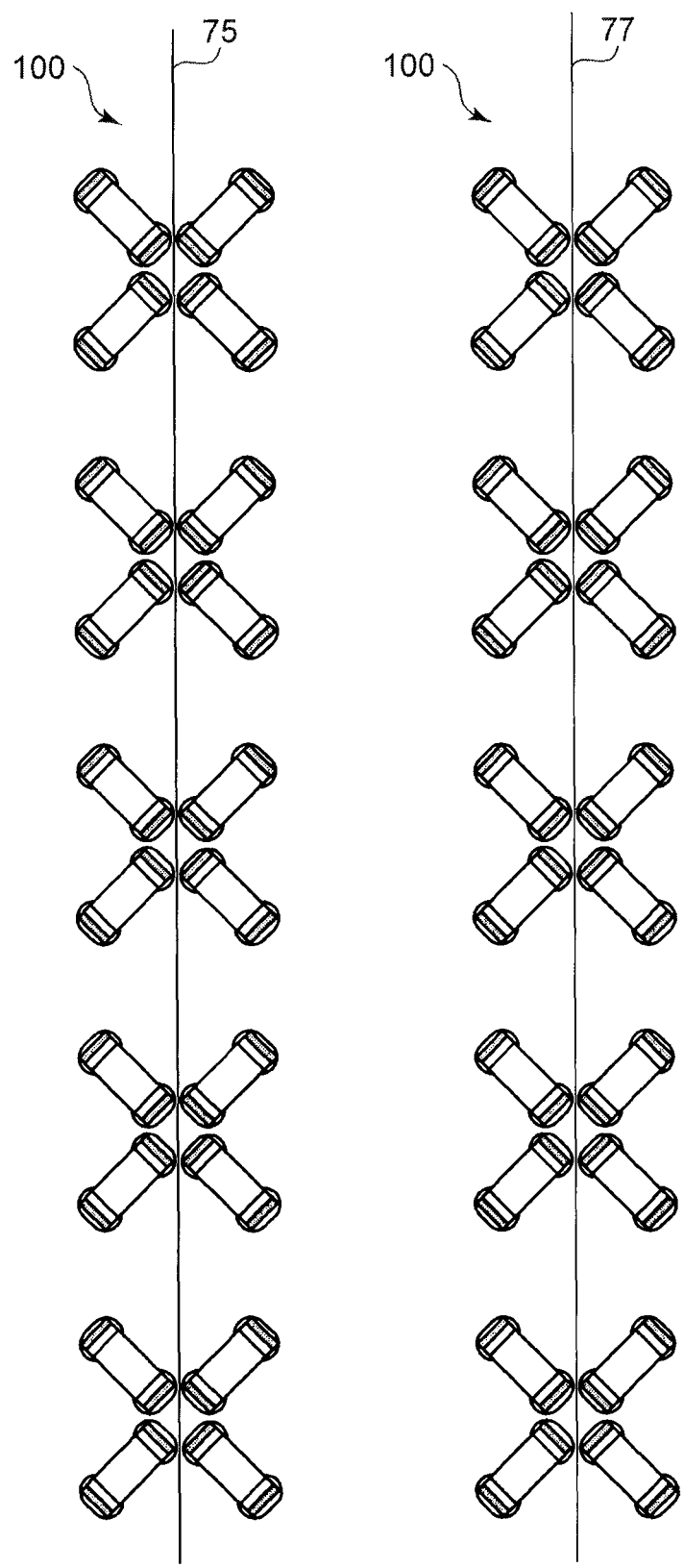
FIG. 6 is a view for describing another pattern used when a plurality of capacitors is mounted on a PCB using the unit arrangement structure.

FIGS. 5 and 6 are views for describing a pattern used when forty capacitors are mounted on a single side of the PCB 50 using the unit arrangement structure 100. In FIG. 5, five unit arrangement structures 100 are arranged at equal intervals along an arrangement axis 71. Similarly, five unit arrangement structures 100 are arranged at equal intervals along an arrangement axis 73 parallel to the arrangement axis 71. The unit arrangement structure axes 201 extend along the arrangement axes 71 and 73, respectively. The number of arrangement axes may be one or three or more, and the maximum number of unit arrangement structures 100 arranged along each arrangement axis is not particularly limited.

In FIG. 6, five unit arrangement structures 100 are arranged at equal intervals along two parallel arrangement axes 75 and 77. The unit arrangement structures 100 have their unit arrangement structure axes 201 and 203 being turned by 45 degrees from the pattern shown in FIG. 5. That is, a bisecting line of the unit arrangement structure axes 201 and 203 extends along the arrangement axis 75 or 77. The arrangement structures shown in FIGS. 5 and 6 generate less noise from the PCB 50 than the arrangement structure employing different basic patterns shown in FIG. 3 even when they are mounted on a single side of the PCB 50. Moreover, when a plurality of capacitors having the arrangement structures shown in FIGS. 5 and 6 is mounted on both sides of the PCB 50, the noise suppression effect can be further increased.

In the embodiments of the present invention, it is not necessary to limit the orientations of the internal electrodes 53*a* and 53*b* with respect to the top surface of the PCB 50 and the polarities of voltages applied to a pair of series-connected capacitors. Moreover, in the case of double-side mounting, it is not necessary to arrange the capacitors so as to be strictly symmetrical with respect to a plane of the PCB and to connect the top-side capacitors and the back-side capacitors in series. Therefore, the mounting restrictions are reduced and embodiments of the present invention can be applied to broader applications. Furthermore, because it is not necessary to incorporates anti-vibration measures into capacitors per se, low-cost capacitors can be used.

Although embodiments of the present invention has been described so far in accordance with specific embodiments illustrated in drawings, the invention is not limited to the embodiments illustrated in the drawings. As a matter of course, any known configurations may be used as long as the functions of embodiments of the present invention are executed thereby.

Embodiments of the present invention can be applied to a printed circuit board mounting thereon a plurality of capacitors.

In accordance with the above-mentioned aspects of the present invention, it is possible to provide an arrangement structure of a laminated ceramic capacitor on a circuit board, capable of effectively achieving noise reduction. Moreover, it is possible to provide an arrangement structure with a few restrictions for noise reduction. Furthermore, it is possible to provide an arrangement structure capable of achieving noise reduction via single-side mounting on a printed circuit board. Furthermore, it is possible to provide a printed circuit board mounting thereon a plurality of laminated ceramic capacitors having the arrangement structure.

It should be understood and appreciated that arrangements of capacitors on printed circuit boards, as discussed and broadly contemplated herein, can be employed in a wide variety of operating environments, including but not limited to computers, cell phones, digital cameras, and other mobile devices. Thus, while the foregoing discussion presents a computer system as a possible operating environment for such arrangements according to embodiments of the invention, it of course should be understood that this is provided by way of a non-limiting example. Capacitors have multiple applications, such as signal tuning or voltage conversion, necessary to the function of most electronic devices.

This disclosure has been presented for purposes of illustration and description but is not intended to be exhaustive or limiting. Many modifications and variations will be apparent to those of ordinary skill in the art. The embodiments were chosen and described in order to explain principles and practical application, and to enable others of ordinary skill in the art to understand the disclosure for various embodiments with various modifications as are suited to the particular use contemplated.

In the drawings and specification there has been set forth a preferred embodiment of the invention and, although specific terms are used, the description thus given uses terminology in a generic and descriptive sense only and not for purposes of limitation.

If not otherwise stated herein, it is to be assumed that all patents, patent applications, patent publications and other publications (including web-based publications) mentioned and cited herein are hereby fully incorporated by reference herein as if set forth in their entirety.

What is claimed is:

1. An apparatus comprising:
one or more processors;
a printed circuit board in operative connection with the one or more processors; and
a plurality of unit arrangements disposed on the printed circuit board, the a plurality of unit arrangements each comprising:
two capacitor pairs, the two capacitor pairs comprising:
two capacitors situated on the printed circuit board along a first axis bisecting the two capacitors length-wise; and
two other capacitors situated on the printed circuit board along a second axis bisecting the two other capacitors length-wise;
wherein a terminal of a capacitor situated along the first axis is disposed near a terminal of a capacitor situated along the second axis;
wherein the first axis and the second axis intersect substantially at a right angle; and
wherein, in a unit arrangement, the distance between a terminal of a capacitor situated along the first axis and a terminal of a capacitor situated along the second axis is less than the length of a capacitor;
wherein a first set of unit arrangements is disposed on the printed circuit board along a first arrangement axis;
wherein a second set of unit arrangements is disposed on the printed circuit board along a second arrangement axis; and
wherein the first arrangement axis is parallel to the second arrangement axis.

2. The apparatus according to claim 1, wherein:
the two capacitors situated on the printed circuit board along the first axis comprise a first capacitor and a second capacitor;
the two other capacitors situated on the printed circuit board along the second axis comprise a third capacitor and a fourth capacitor;
external terminals of the first capacitor and the third capacitor are connected via a wiring pattern on the printed circuit board; and
external terminals of the second capacitor and the fourth capacitor are connected via another wiring pattern on the printed circuit board.

3. The apparatus according to claim 1, wherein outside dimensions of the two capacitors situated on the printed circuit board along the first axis are approximately equal to outside dimensions of the two other capacitors situated on the printed circuit board along the second axis.

4. The apparatus according to claim 1, wherein the printed circuit board comprises a front side and a back side; and wherein a first unit arrangement is disposed on the front side and a second unit arrangement is disposed on the back side.

5. The apparatus according to claim 1, wherein the first axis and the second axis are arranged on a printed circuit board so as to form an X shape for capacitors of unit arrangements aligned about the first arrangement axis and the second arrangement axis.

6. The apparatus according to claim 1, wherein the first axis and the second axis are arranged on a printed circuit board so as to form a cross shape for capacitors of unit arrangements aligned about the first arrangement axis and the second arrangement axis.

7. The apparatus according to claim 1, wherein:
the first arrangement axis extends at a 45 degree angle to the first axis and the second axis such that the arrangement axis bisects the first axis and the second axis.

8. The apparatus according to claim 1, wherein, in a unit arrangement, a connecting face of an external terminal of a first capacitor along the first axis and a connecting face of an external terminal of a second capacitor along the first axis oppose each other at a predetermined distance less than the length of a capacitor.

9. The apparatus according to claim 7, wherein at least one unit arrangement is disposed on a front side of the printed circuit board and at least one unit arrangement is disposed on a back side of the printed circuit board.

* * * * *